United States Patent
Chuang et al.

(10) Patent No.: US 7,701,034 B2
(45) Date of Patent: Apr. 20, 2010

(54) DUMMY PATTERNS IN INTEGRATED CIRCUIT FABRICATION

(75) Inventors: Harry Chuang, Austin, TX (US); Kong-Beng Thei, Hsin-Chu (TW); Cheng-Cheng Kuo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 11/281,030

(22) Filed: Nov. 17, 2005

(65) Prior Publication Data
US 2006/0163665 A1 Jul. 27, 2006

Related U.S. Application Data

(60) Provisional application No. 60/645,646, filed on Jan. 21, 2005.

(51) Int. Cl.
*H01L 27/088* (2006.01)
(52) U.S. Cl. .................. 257/508; 257/288; 257/401; 257/499; 257/506; 257/510; 257/E21.621; 257/E21.635; 257/E29.001; 438/197; 438/294; 438/400; 438/585; 438/926
(58) Field of Classification Search ................. None
See application file for complete search history.

(56) References Cited

U.S. PATENT DOCUMENTS

| | | | |
|---|---|---|---|
| 5,441,915 A * | 8/1995 | Lee .............................. 438/631 |
| 5,686,338 A | 11/1997 | Liu |
| 5,790,417 A * | 8/1998 | Chao et al. .................... 716/21 |
| 6,074,938 A | 6/2000 | Asamura |
| 6,103,592 A | 8/2000 | Levy et al. |
| 6,153,919 A | 11/2000 | Sjödin et al. |
| 6,261,883 B1 * | 7/2001 | Koubuchi et al. ........... 438/197 |
| 6,461,906 B1 | 10/2002 | Lung |
| 6,492,073 B1 | 12/2002 | Lin et al. |
| 6,882,025 B2 | 4/2005 | Yeo et al. |
| 6,949,443 B2 | 9/2005 | Ke et al. |
| 7,420,277 B2 * | 9/2008 | Chen et al. .................. 257/758 |
| 2002/0063335 A1 * | 5/2002 | Ozawa et al. ................ 257/758 |
| 2002/0184606 A1 * | 12/2002 | Ohba et al. .................... 716/11 |
| 2003/0001155 A1 * | 1/2003 | Kotani et al. ................. 257/48 |
| 2003/0177464 A1 * | 9/2003 | Takechi et al. ................ 716/10 |
| 2004/0063038 A1 | 4/2004 | Shin et al. |
| 2004/0188844 A1 * | 9/2004 | Suga et al. .................. 257/758 |
| 2004/0188849 A1 * | 9/2004 | Suga ........................... 257/773 |

FOREIGN PATENT DOCUMENTS

JP 09-311432 * 12/1997

* cited by examiner

*Primary Examiner*—Andy Huynh
*Assistant Examiner*—Hoang-Quan T Ho
(74) *Attorney, Agent, or Firm*—Slater & Matsil, L.L.P.

(57) ABSTRACT

An embodiment of the invention provides a semiconductor integrated circuit device having a dummy pattern for improving micro-loading effects. The device comprises an active region in a substrate and an isolation region in the substrate adjacent the active region. A plurality of dummy patterns are formed over the isolation region, wherein each dummy pattern is aligned parallel to and lengthwise dimension of the active region. The dummy patterns may have non-uniform spacing or non-uniform aspect ratios. The dummy pattern may have, in plan view, a rectangular shape, wherein its length is greater than the lengthwise dimension of the active region. The spacing between the dummy pattern and the active region may be less than about 1500 nm.

14 Claims, 4 Drawing Sheets

DUMMY PATTERNS IN INTEGRATED CIRCUIT FABRICATION

This application claims the benefit of U.S. Provisional Application No. 60/645,646, filed on Jan. 21, 2005, entitled "A Method of Dummy Pattern in Semiconductor Technology," which application is hereby incorporated by reference in its entirety.

TECHNICAL FIELD

This invention relates to semiconductor devices, and more particularly to dummy patterns in integrated circuit (IC) fabrication.

BACKGROUND

The existence of pattern loading effect in films has been well known. There is a problem that a micro-loading effect occurs due to a difference in pattern density and degrades the uniformity of pattern sizes. The micro-loading effect pertains to a phenomenon occurring upon simultaneously etching or polishing a pattern of a higher density and a pattern of a lower density. Due to a difference in the etching/polishing rate of a film from one location to another, the amount of reaction produced by the etching/polishing becomes locally dense or sparse, and the convection of a large amount of reaction products by etching with a low volatility causes a non-uniformity in the etching rate. Large variations in effective pattern density have been shown to result in significant and undesirable effects such as pattern dimension deviation, critical dimension uniformity (CDU), and thickness variation.

To counteract this effect, a layout design step known as dummy fill, where the circuit layout is modified and dummy patterns are added to locations with low pattern density, was developed. The adding of dummy patterns helps to achieve uniform effective pattern density across the wafer, therefore avoiding problems.

Conventionally, such dummy patterns are left in place. In the case dummy patterns are conductive, they form parasitic capacitance with the interlayer metal wiring. The parasitic capacitance contributes to the RC time delay due to charging and discharging time. The scaling scheme of ILD and higher operation frequency for advanced process will cause severe performance degradation due to unwanted parasitic capacitance. At the present stage of the development of the integrated circuit art, there is an increasing demand in the field of digital integrated circuits for faster switching circuits. As when the switching demands of the integrated circuits go into higher frequency, the slowing effect produced by parasitic capacitance becomes an increasing problem.

Since dummy patterns are not removed, they cannot be formed in an active region, or oxide defined (OD) region. Leftover dummy patterns not only increase parasitic capacitance and degrade device performance, but also affect the subsequent processes. One of the conventional solutions is to place dummy patterns surrounding, but not in, the active regions. Not being able to be placed in desired regions, the effect of the dummy patterns is significantly limited. Such an arrangement also increases the difficulty of fine-tuning the dummy patterns. There were also efforts made to put dummy patterns into dummy active regions (DODs), surrounding dummy regions, or regions having neither an oxide nor an active device. However, the results have generally not proven satisfactory.

There is another effect that also affects the semiconductor process. When two devices are too close to each other, optical proximity effects occur. Optical proximity effects are due to light diffraction and interference between closely spaced features on the reticle resulting in the widths of lines in the lithographic image being affected by other nearby features. One component of the proximity effect is optical interaction among neighboring features; other components arise from similar mechanisms in the resist and etch processes.

The micro-loading and proximity effects affect the gate formation of the MOS devices. The critical dimension, or the gate length of a MOS device, may deviate significantly from design. For example, if an 80 nm gate length is desired, when the critical dimension of a MOS device in a dense device area is on target at 80 nm, the critical dimension of a MOS device in an isolated device area may reach around 110 nm, or 30 nm more than the target value in certain cases. Also the deviations for nMOS and pMOS gates are different, causing N/P ratio mismatching and complicating circuit design.

While advantages of using dummy patterns in IC fabrication are appreciated in the art, many problems remain regarding dummy pattern structure and arrangement. For example, such problems may include device critical dimension control, optical proximity effects, optical proximity correction (OPC) cycle-time, design complexity, device mismatch, and process window and yield. Accordingly, there remains in semiconductor manufacturing a need for simplified yet robust dummy patterns.

SUMMARY OF THE INVENTION

These and other problems are generally solved or circumvented, and technical advantages are generally achieved by preferred embodiments of the present invention that provide dummy pattern structures, layouts, and methods of manufacture.

A preferred embodiment of the invention provides a semiconductor device. The device comprises: a substrate, an isolation region formed in the substrate, and an active region in the substrate adjacent the isolation region. Preferably, the active region has in plan view a lengthwise dimension. Preferred embodiments further include a dummy pattern or dummy feature over the isolation region. Preferably, the dummy pattern has a lengthwise dimension greater than a lengthwise dimension of the active region and has in plan view a rectangular shape comprising long sides and short sides.

The long sides of the dummy patterns may be spaced a lateral distance from the active region. They may be aligned substantially parallel to the lengthwise dimension of the active region. Preferably, the lateral distance is less than about 1500 nm, and more preferably less than about 500 nm. In other embodiments of the invention, the dummy features have non-uniform spacings with respect to the active region. The dummy patterns may have non-uniform widths.

In an embodiment of the invention, the long side of the dummy pattern is greater than about 0.6 µm, and in another embodiment the short side of the dummy pattern is less than about 0.3 µm. Preferably, a dummy pattern width is between 0.1 and 5 times an active region width. The dummy pattern may have a height relative to a surface of the isolation region, and it may be between about 500 and 10,000 angstroms. Embodiments may further comprise a transistor formed in the active region. The dummy pattern, the transistor, or the active region may comprise the same material. In still other embodiments of the invention, the active region may comprise a conductive feature aligned substantially parallel with the dummy pattern, wherein the conductive feature and dummy patterns are on a same conductive level of the semiconductor device.

Still other embodiments of the invention provide a semiconductor integrated circuit (IC) device having a dummy pattern for improving micro-loading effects. The semiconductor integrated circuit device comprises: an active region in a substrate, wherein the active region has in plan view a lengthwise dimension, and an isolation region in the substrate adjacent the active region. Embodiments preferably further include a plurality of dummy patterns on the isolation region, wherein the plurality of dummy patterns have non-uniform spacings and are aligned substantially parallel to the active feature.

Preferably, lengthwise dimensions of the plurality of dummy patterns are greater than a lengthwise dimension of the active region. The length of each dummy pattern may be greater than about 0.6 μm. The IC device may further comprise an active feature having a gate electrode with a width less than about 0.2 μm.

In other embodiments, the plurality of dummy patterns in the IC device comprises: a first dummy pattern formed adjacent the active region, and a second dummy pattern spaced apart from the active region. Preferably, the width of the second dummy pattern is greater than the width of first dummy pattern. In embodiments comprising a plurality of dummy patterns, the dummy pattern having the minimum width is preferably spaced nearest the active region, and the dummy pattern having the maximum width is preferably spaced farthest from the active region.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The intermediate stages of manufacturing a preferred embodiment of the present invention are illustrated throughout the various views and illustrative embodiments of the present invention.

This invention relates generally to semiconductor device fabrication and more particularly to structures and methods for strained transistors. The present invention will now be described with respect to preferred embodiments in a specific context, namely the creation of a CMOS device. Therefore, the specific embodiments discussed are merely illustrative of specific ways to make and use the invention, and do not limit the scope of the invention.

Figure 1:
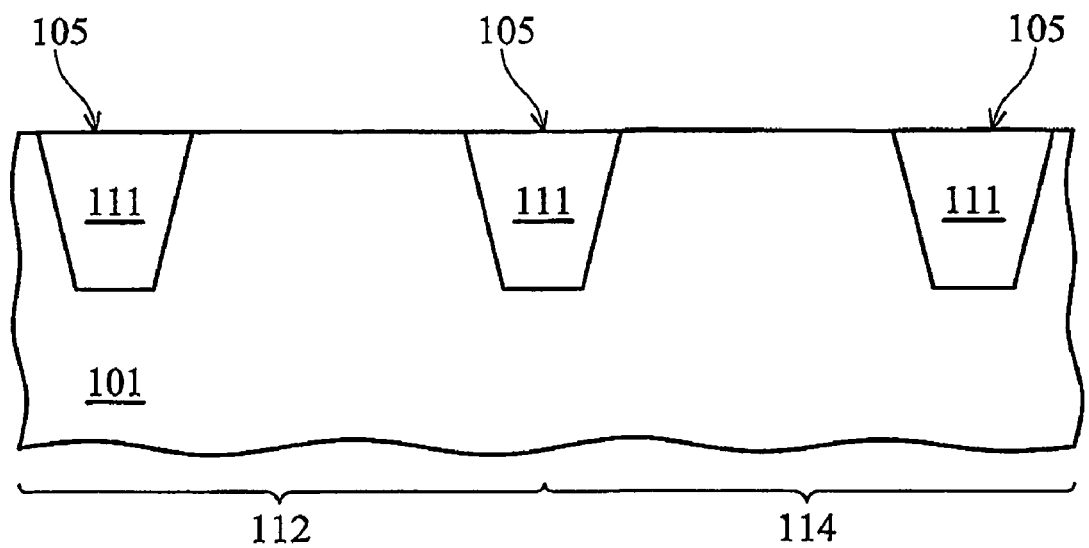
FIG. 1 is a cross-sectional view of an intermediate CMOS device according to an embodiment of the invention.

FIG. 1 illustrates an embodiment of the invention that includes a substrate 101 for forming a CMOS device. The substrate 101 may comprise Si, Ge, SiGe, GaAs, GaAlAs, InP, GaN, and combinations thereof. The substrate 101 may further include hybrid orientation substrates fabricated with silicon on insulator (SOI) technology. Formed within the substrate 101 are isolation regions such as field oxide, or preferably, shallow trench isolation (STI) regions 105. The STI regions 105 may be etched by anisotropic plasma etching. If the semiconductor substrate is a silicon substrate, the anisotropic plasma etching may employ a plasma with fluorine chemistry, e.g., containing chemical species such as $CF_4$.

The STI regions 105 include a trench filling material 111 such as chemical-vapor-deposited (CVD) silicon oxide (e.g., $SiO_2$). The trench filling material 111 may also be a combination of materials, such as CVD silicon oxide and CVD poly-silicon. The depth of the isolation structure may be in the range of about 200 to about 6000 angstroms.

In other embodiments (not illustrated), isolation regions may be optimized to selectively induce stress in n-channel and p-channel transistors separately. For example, a first isolation trench includes a first liner, and a second isolation trench includes a second liner, or none at all. By way of example, a liner may be a nitride layer. The second trench may be lined with a nitride layer that has been modified, e.g., implanted with ions or removed. In another example, the first material can be an oxynitride (a nitrided oxide). In this case, the second trench may be lined with an oxide liner or no liner at all, as examples. A liner can then be modified in some, but not all of the plurality of trenches.

Continuing with FIG. 1, the STI regions 105 preferably divide the substrate 101 into a first active region 112 and a second active region 114. Theses regions are suitable for forming n-channel and/or p-channel field effect transistors (FETs), or other semiconductor devices. In the exemplary embodiment provided below, a CMOS device comprises, an n-channel transistor (NFET) formed in the first region 112 and a p-channel transistor (PFET) formed in the second region 114. Therefore, the first region 112 includes a p-type dopant, and the second active region 114 includes an n-type dopant.

Figure 2A:
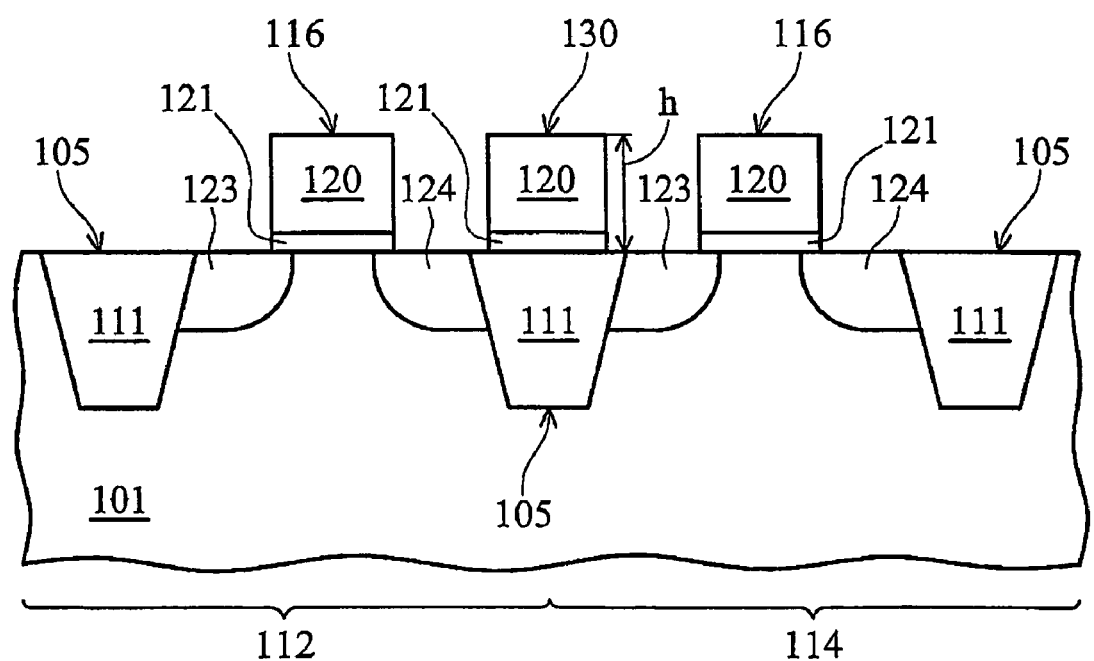
FIGS. 2a and 2b are cross sectional and plan views of a dummy pattern according to embodiments of the invention.

Turning now to FIG. 2a, there is illustrated the structure of FIG. 1 after forming a gate electrode 116 and a dummy pattern 130. As illustrated in FIG. 2a, the dummy pattern 130 is preferably formed between adjacent active semiconductor areas, such as the first region 112 and the second region 114. The gate electrode 116 and the dummy pattern 130 preferably comprise the same material, a gate electrode material 120, which allows for simultaneously forming both structures using conventional methods.

The gate electrode material 120 preferably comprises poly-crystalline-silicon (poly-Si). In other embodiments, it may comprise poly-crystalline silicon-germanium (poly-SiGe), a refractory metal such as molybdenum and tungsten, compounds such as titanium nitride, or other conducting materials. The gate electrode 116 may further include an implant to alter the work function of the electrode. In a preferred embodiment, a plasma etch using chlorine and bromine chemistry etches the gate electrode material 120 with a high etch selectivity with respect to the gate dielectric 121.

Underlying the gate electrode 116 is a gate dielectric 121, which may also be formed according to conventional deposition and patterning techniques. As illustrated in FIG. 2a, the gate dielectric 121 may underlie the dummy pattern 130 as well. The dummy pattern 130 preferably has a height, h, between about 500 and 10,000 angstroms with respect to the surface of the isolation region 111.

The gate dielectric 121 may include silicon oxide having a thickness from about 6 to 100 Å, and more preferably less than about 20 Å. In other embodiments, the gate dielectric 121 may include a high-k dielectric having a k-value substantially greater than about 7. Possible high-k dielectrics include $Ta_2O_5$, $TiO_2$, $Al_2O_3$, $ZrO_2$, $HfO_2$, $Y_2O_3$, $L_2O_3$, and their aluminates and silicates. Other suitable high-k gate dielectrics may include a hafnium-based materials such as $HfO_2$, $HfSiO_x$, $HfAlO_x$.

Continuing with FIG. 2a, source 123 and drain 124 regions are formed using a source/drain implant suitable for forming NMOS and PMOS devices. The source/drain regions are implanted using methods known in the art. Underlying the gate electrode 120 and the gate dielectric 121 is a charge carrier channel region connecting each device's respective source/drain regions. Because a conventional source/drain implant uses the gate electrode 120 and gate electrode spacers as an implant mask, the source/drain implant may be performed after forming the electrode spacers. In other embodiments, other methods of forming source 123 and drain 124 regions may be used.

In alternative embodiments, the channel/substrate orientation may be selected with a view towards optimizing the appropriate charge carrier mobility using SOI hybrid orientation substrates. For example, an NMOS channel may be oriented along the <100> the direction, which is the direction of maximum electron mobility for a {100} substrate. Alternatively, a PMOS channel may be oriented along the <110> direction, which is the direction where hole mobility is maximum for a {110} substrate.

Figure 2B:
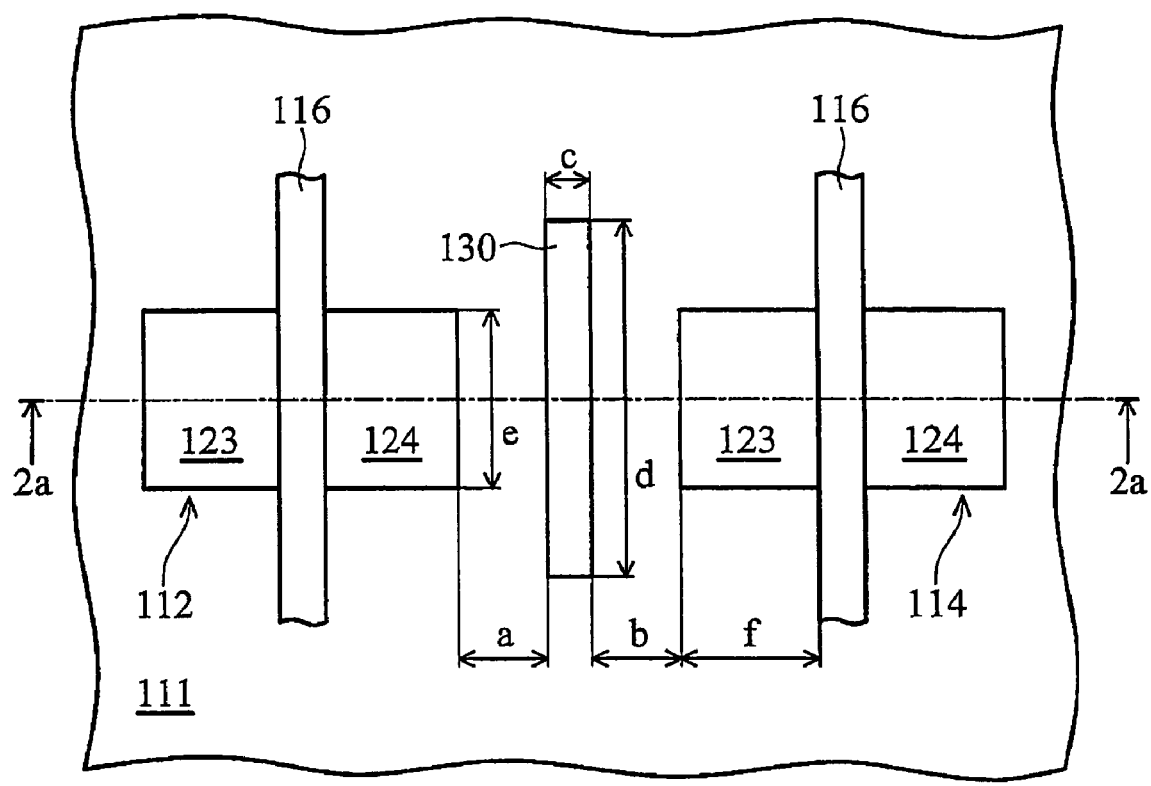

In FIG. 2b, there is a plan view of the intermediate CMOS device of FIG. 2a. As illustrated in FIG. 2b, the dummy pattern 130, which is located over STI region 111, is spaced a lateral distance, a, from the first active region 112 and a lateral distance, b, from the second active region 114. Preferably, the dummy pattern in the isolation region is aligned substantially equidistant between the both active regions, i.e., a=b.

In other embodiments, the spacing between dummy patterns will change and can be generated and fine tuned by a dummy utility system. Since nMOS and pMOS devices react differently to micro-loading effects, the spacing between the dummy patterns in an NMOS region and a pMOS region can be different. Non-uniform spacing can further increase the accuracy of the critical dimension and lower the deviations.

Continuing with FIG. 2b, the dummy pattern 130 is aligned substantially parallel to adjacent active regions 112 and 114. As illustrated in FIG. 2b, the dummy pattern 130 preferably comprises in plan view a rectangular shape, although other shapes are suitable. As illustrated, the rectangular shape comprises a pair of long sides and a pair of short sides. For descriptive convenience, the long and short sides may define a rectangle length, d, and a rectangle width, c, as illustrated in FIG. 2b.

Preferably, the rectangle length, d, is greater than about 0.6 µm, and/or the rectangle width, c, less than about 0.3 µm. A ratio of the rectangle length, d, and a rectangle width, c, may define an aspect ratio of the rectangle. Preferably the rectangle aspect ratio is greater than 1, i.e., d/c>1.

Continuing with FIG. 2b, the long sides of the dummy pattern 130 are aligned substantially parallel with the lengthwise dimension, e, of the active region 112, as illustrated in FIG. 2b. In embodiments comprising a plurality of dummy patterns, the length, width, and aspect ratio of each individual dummy pattern may be independently adjusted. In embodiments of the invention, the plurality of dummy patterns may comprise non-uniform width, aspect ratio, or length.

Applicants have discovered several additional preferred dimensional parameters for the dummy pattern 130. Preferably, the lateral distance (e.g., a or b) between the dummy pattern 130 and the active region is less than about 1500 nm, and more preferably less than about 500 nm. In plan view, the dummy pattern 130 preferably may have a surface area between about $10^{-3}$ and 1 µm$^2$.

In other embodiments, the dummy pattern width, c, is between 0.1 and 5 times an active region width, f. In embodiments of the invention, the dummy pattern width, c, may be less than about 0.3 µm, and the active region width, f, may be less than about 0.2 µm.

The length, d, of the dummy pattern 130 is preferably greater than a length, e, of a neighboring active region. With d>e, both of the opposing short lengths of the dummy pattern 130 preferably extend beyond edges of a neighboring active region, as illustrated by the first and second active regions 112 and 114 in FIG. 2b.

As noted, in embodiments of the invention, the first active region 112 or the second 114 active region may comprise a transistor. The transistor may comprise doped or undoped polysilicon, silicon germanium, a metal gate, a conductive feature, a silicide gate, and combinations thereof, for example. In embodiments wherein the dummy patterns are on a same conductive level of the semiconductor device, the conductive feature aligned substantially parallel with the dummy pattern.

In still other embodiments, the conductive feature and dummy patterns independently comprise a structure selected from the group consisting essentially of a trench, a via, a patterned metal line, and combinations thereof. The dummy pattern 130 and the active regions 112/114 may comprise the same material, such as Si, Ge, SiGe, and combinations thereof. Preferably, the spacing between a conductive and dummy pattern is less than about 1500 nm.

The preferred embodiment discussed above illustrates one of the methods for forming gate structures. Other methods may also be used in alternative embodiments. If lithography, etching, or CMP are involved, micro-loading effects (e.g., etching or epitaxy) occur and dummy patterns are preferably formed.

Following the embodiments described above, the intermediate CMOS device is completed using conventional semiconductor processing steps as are known in the art. A silicide may be formed by depositing a metal, such as titanium or cobalt, and then treated to form self-aligned silicide, or salicide, on top of the gate electrode and the source/drain regions and other areas to provide a lower resistance and improve device performance. Following the salicide step, interlevel insulation layers are formed, above the substrate using deposition steps to deposit oxide, nitride or other conventional insulation layers, typically silicon dioxide is formed. Contact areas are patterned and etched into the insulators to expose the source, drain and gate electrodes. The resulting vias are filled with conductive material to provide electrical connectivity from metallization layers above the interlevel insulating layers and down to the gate electrodes, the source and the drain regions. Metallization layers of aluminum, or copper, may be formed over the interlevel insulation layers using known techniques, such as a aluminum metallization process, or a dual damascene copper metallization process to provide one, or several, wiring layers that may contact the vias and make electrical connections to the gate electrodes and the source/drain regions.

Figure 3:
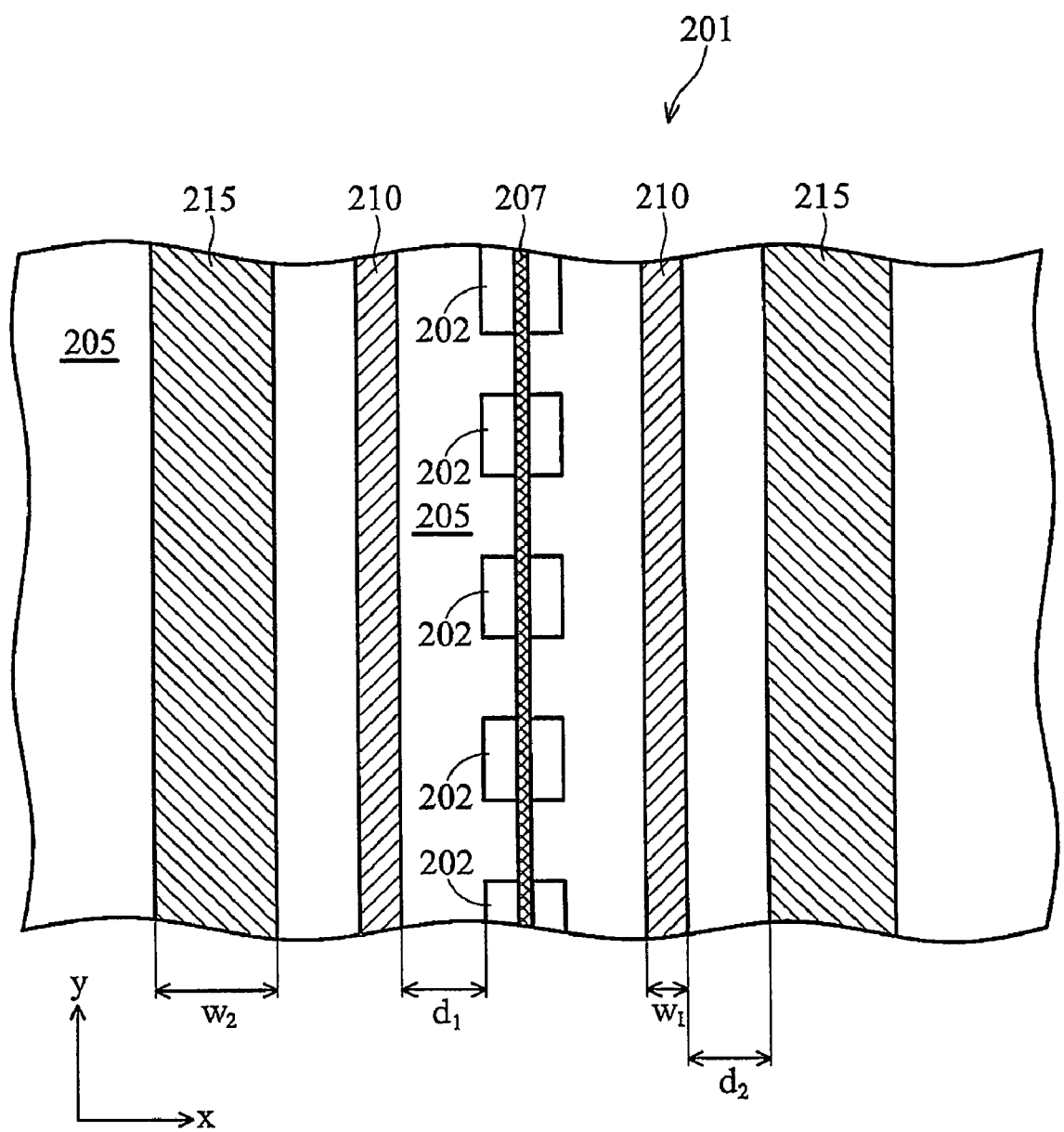
FIGS. 3 and 4 are plan views of a semiconductor device having dummy patterns according to other embodiments of the invention.

Turning now to FIG. 3, there is illustrated another embodiment of the invention. FIG. 3 is a plan view of a semiconductor integrated circuit device 201 having a plurality of dummy patterns for improving micro-loading effects. For ease of illustration, features of the various embodiments may be described in terms of widthwise and lengthwise dimensions. To further aid in the discussion, the widthwise dimension may be measured along an x-axis, and the lengthwise dimension may be measured along a y-axis, such as shown in FIG. 3.

Continuing with FIG. 3, a plurality of active regions 202 are formed within the isolation region 205. A first plurality of dummy patterns 210 having a first width, $w_1$, are formed a first spacing, $d_1$, from the active regions 202. A second plurality of dummy patterns 215 having a second width, $w_2$, are formed a second spacing, $d_2$, from the first plurality of dummy patterns 210. In one embodiment, the dummy pattern with the narrowest spacing, e.g., $d_1$, is preferably spaced nearest or adjacent the active regions 202. The dummy pattern with widest spacing, e.g., $d_2$, is preferably spaced apart and more preferably farthest from the active regions 202.

The active regions 202 may further include active features. For example, an active feature may comprise a gate electrode 207, which is preferably formed substantially parallel to the dummy patterns. For the dummy patterns, a ratio of the lengthwise to widthwise dimensions defines an aspect ratio, which is preferably greater than about 1. In keeping with preferred embodiments of the invention, the lengthwise dimensions of the active regions 202 and the dummy patterns 210 and 215 are aligned substantially parallel.

In preferred embodiments of the invention comprising a plurality of dummy patterns, the narrowest dummy pattern (e.g., 210) is preferably spaced nearest or adjacent the active regions 202. The widest dummy pattern (e.g., 215) is preferably spaced apart and more preferably farthest from the active regions 202.

Figure 4:
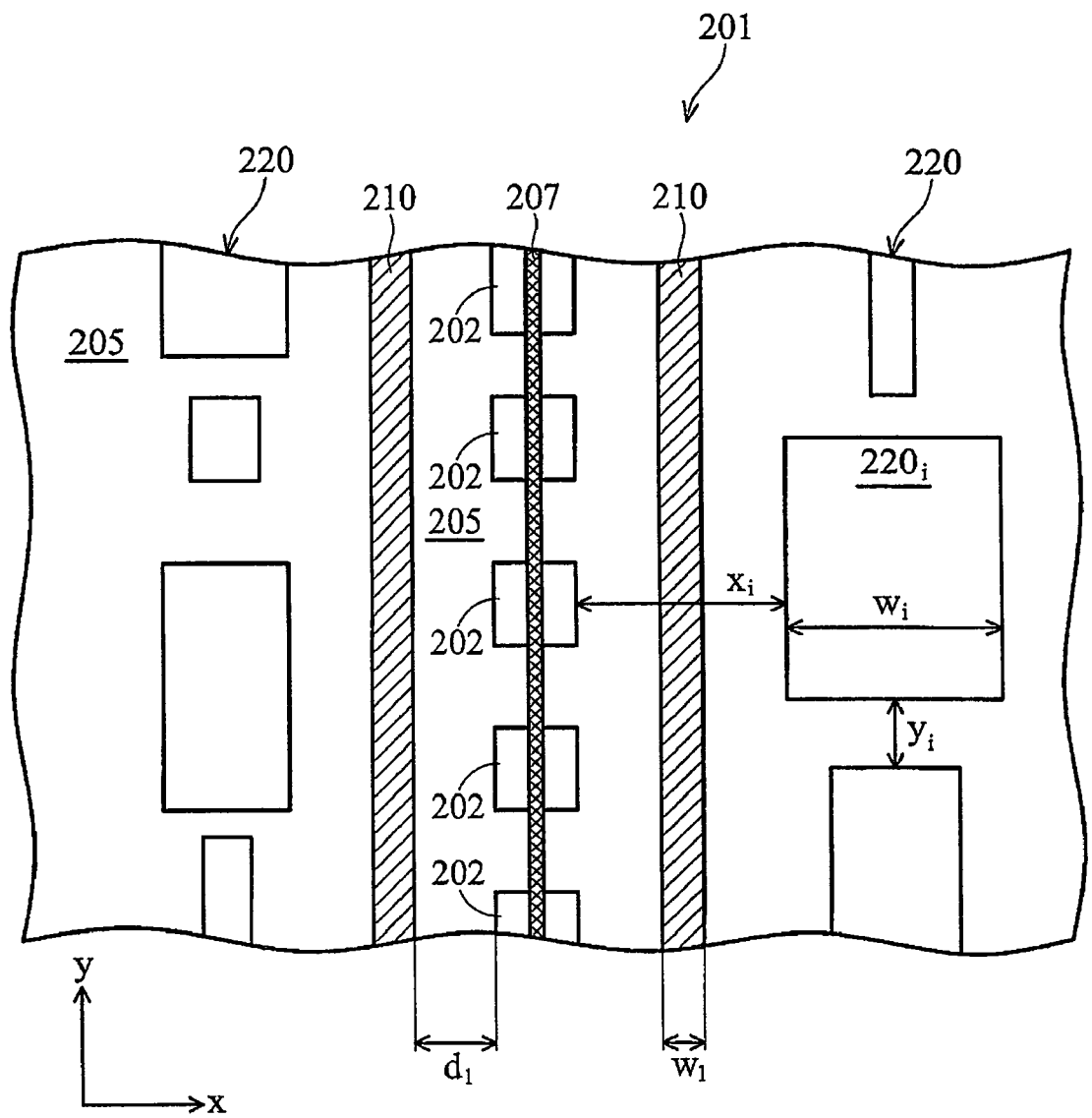

In other embodiments of the invention, one or more of the plurality of dummy patterns is comprised of dummy patterns having independently variable parameters. For example, the embodiment of FIG. 4 is comprised of the elements of FIG. 3, wherein the second plurality of dummy patterns 215 is replaced with a third plurality of dummy patterns 220. In this embodiment of the invention, each member 220$i$ of the third plurality 220 has an independently variable parameter, which may include width, $w_i$, inter-pattern spacing, $y_i$, and a spacing from a neighboring active region, $x_i$. Because the dummy patterns of preferred embodiments may have a uniform or non-uniform spacing, the integrated circuit 201 may provide for asymmetric processing wherein predetermined areas, such as core and non-core areas, are independently optimized. Accordingly, the present invention provides dummy patterns with non-uniform spacing or non-uniform width while a plurality of dummy patterns are applied for active features.

By using preferred embodiments of the present invention, a method of dummy pattern in semiconductor technology improves critical device dimension control, proximity effect, OPC cycle-time reduction (for example, approximately 69%). Embodiments also reduce design complexity, prevent device mismatch, improve process window and higher yield. Embodiments improve polysilicon-gate critical dimension uniformity (CDU), eliminate polysilicon-gate proximity effects, and they improve saturation current uniformity and device matching. Advantageously, preferred embodiments require no additional masking or processing. The provided dummy patterns decrease manufacturing data file sizes (e.g., gds files) and also the hierarchy structure of new dummy polysilicon (DPO) is dramatically improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor integrated circuit device comprising:
   an active region in a substrate, the active region having in plan view a lengthwise dimension;
   an active feature comprising a gate electrode over the active region;
   an isolation region in the substrate adjacent the active region; and
   a plurality of dummy patterns on the isolation region and at a same level as the active feature, with no gate electrode between any two of the plurality of dummy patterns, wherein the plurality of dummy patterns has non-uniform spacings and is aligned substantially parallel to the active feature, wherein lengthwise dimensions of the plurality of dummy patterns are greater than the lengthwise dimension of the active region, and wherein the plurality of dummy patterns comprises:
   a first dummy pattern formed adjacent the active region, wherein the first dummy pattern has a first width; and
   a second dummy pattern spaced apart from the active region, wherein the second dummy pattern has a second width greater than the first width.

2. The semiconductor integrated circuit device of claim 1, wherein the active feature comprises the gate electrode having a width less than about 0.2 μm.

3. The semiconductor integrated circuit device of claim 1, wherein the lengthwise dimension of each dummy pattern is greater than about 0.6 μm.

4. The semiconductor integrated circuit device of claim 1, wherein the plurality of dummy patterns further comprises a dummy pattern having a minimum width and a dummy pattern having a maximum width.

5. The semiconductor integrated circuit device of claim 4, wherein the dummy pattern having the minimum width is spaced nearest the active region.

6. The semiconductor integrated circuit device of claim 4, wherein the dummy pattern having the maximum width is spaced farthest from the active region.

7. A semiconductor device having a dummy feature, the semiconductor device comprising:
   an active region in a substrate;
   an isolation region adjacent the active region;

an active feature comprising a gate electrode on the active region; and a plurality of dummy features on the isolation region and at a same level as the active feature, with no gate electrode between any two of the plurality of dummy features, wherein the dummy features have non-uniform spacings and are aligned substantially parallel to the active feature, wherein lengthwise dimensions of the dummy features are greater than a lengthwise dimension of the active region, and wherein one of the dummy features having a minimum width is spaced nearest the active feature.

8. The semiconductor device of claim 7, wherein the dummy features have non-uniform widths.

9. The semiconductor device of claim 7, wherein the plurality of dummy features comprises:

a first dummy pattern on the isolation region and immediately neighboring the active region with a first spacing therebetween; and a second dummy pattern on the isolation region and immediately neighboring the first dummy pattern with a second spacing therebetween, wherein the first and the second dummy patterns cross a line uni-directionally extending from the active region in a widthwise direction perpendicular to a lengthwise direction of the active feature, and wherein the second spacing is greater than the first spacing.

10. A semiconductor device comprising:

an active region in a substrate, the active region having a lengthwise direction and a widthwise direction perpendicular to the lengthwise direction;

an active feature directly over the active region and extending in the lengthwise direction, wherein the active feature comprises a gate electrode;

an isolation region adjacent the active region;

a first dummy pattern on the isolation region and immediately neighboring the active region with a first spacing therebetween; and a second dummy pattern on the isolation region and immediately neighboring the first dummy pattern with a second spacing between the first dummy pattern and the second dummy pattern, wherein the first and the second dummy patterns cross a line uni-directionally extending from the active region in the widthwise direction, wherein the second spacing is greater than the first spacing, and wherein the first and second dummy patterns are at the same level as the active feature.

11. The semiconductor device of claim 10, wherein lengthwise dimensions of the first and the second dummy patterns are greater than a lengthwise dimension of the active region.

12. The semiconductor device of claim 10, wherein the second dummy pattern has a greater width than the first dummy pattern.

13. The semiconductor device of claim 10, wherein each of the first and the second dummy patterns has a width of between about 0.1 and about 5 times a width of the active region.

14. The semiconductor device of claim 10, wherein the active feature is the gate electrode of a transistor.

* * * * *